United States Patent
Yamaguchi et al.

(10) Patent No.: US 9,966,164 B2
(45) Date of Patent: May 8, 2018

(54) INSULATED COATED WIRE HAVING A WIRE COATING LAYER OF A RESIN SURROUNDED BY A WIRE ADHESIVE LAYER OF A RESIN

(71) Applicant: HITACHI CHEMICAL COMPANY, LTD., Tokyo (JP)

(72) Inventors: Hiroyuki Yamaguchi, Tokyo (JP); Haruo Ogino, Tokyo (JP); Seiichi Kurihara, Tokyo (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 95 days.

(21) Appl. No.: 14/894,695

(22) PCT Filed: Jun. 10, 2014

(86) PCT No.: PCT/JP2014/065338
§ 371 (c)(1),
(2) Date: Nov. 30, 2015

(87) PCT Pub. No.: WO2014/199981
PCT Pub. Date: Dec. 18, 2014

(65) Prior Publication Data
US 2016/0104928 A1    Apr. 14, 2016

(30) Foreign Application Priority Data
Jun. 11, 2013  (JP) .................... 2013-122664

(51) Int. Cl.
*H01B 7/02*    (2006.01)
*H01B 3/30*    (2006.01)
(Continued)

(52) U.S. Cl.
CPC ............ *H01B 7/0216* (2013.01); *H01B 3/305* (2013.01); *H01B 3/306* (2013.01); *H01B 3/445* (2013.01);
(Continued)

(58) Field of Classification Search
CPC .......... H01B 7/00; H01B 7/02; H01B 7/0216; H01P 3/00
(Continued)

(56) References Cited

U.S. PATENT DOCUMENTS 5,928,757 A    7/1999  Shinada et al.
2009/0202831 A1  8/2009  Honda et al.
(Continued)

FOREIGN PATENT DOCUMENTS

EP    2555204    2/2013
JP    S45-021434    7/1970
(Continued)

OTHER PUBLICATIONS

Office Action of SG Patent Application No. 11201509846W dated Nov. 16, 2016.
(Continued)

*Primary Examiner* — Benny Lee
(74) *Attorney, Agent, or Firm* — Fitch, Even, Tabin & Flannery, LLP

(57) ABSTRACT

The present invention provides an insulated coated wire comprising a wire, a wire coating layer disposed around the wire, and a wire adhesive layer disposed around the wire coating layer, wherein the wire coating layer is of one type of or a combination of two or more types of a fluorine resin, a polyamide-imide resin and a low dielectric polyimide resin having a relative permittivity of less than 3.6 at 10 GHz, and a multi-wire wiring board using the insulated coated wire.

11 Claims, 4 Drawing Sheets

(51) Int. Cl.
*H01B 3/44* (2006.01)
*H05K 3/10* (2006.01)
*H01P 3/08* (2006.01)
*H01P 3/00* (2006.01)
*H01P 3/06* (2006.01)
*H05K 1/02* (2006.01)

(52) U.S. Cl.
CPC ............. *H01P 3/00* (2013.01); *H01P 3/082* (2013.01); *H01P 3/088* (2013.01); *H05K 3/103* (2013.01); *H01P 3/06* (2013.01); *H05K 1/0237* (2013.01); *H05K 1/0298* (2013.01)

(58) Field of Classification Search
USPC ....................................................... 333/236
See application file for complete search history.

(56) References Cited

U.S. PATENT DOCUMENTS

| | | |
|---|---|---|
| 2010/0059248 A1 | 3/2010 | Honda et al. |
| 2010/0206611 A1 | 8/2010 | Honda et al. |
| 2010/0319961 A1 | 12/2010 | Honda et al. |
| 2013/0098656 A1 | 4/2013 | Saito et al. |
| 2014/0329087 A1* | 11/2014 | Masuda et al. ...... C09D 171/00 428/372 |

FOREIGN PATENT DOCUMENTS

| | | |
|---|---|---|
| JP | H2-224398 A | 9/1990 |
| JP | H6-309936 A | 11/1994 |
| JP | H11-260152 A | 9/1999 |
| JP | 2002-050850 A | 2/2002 |
| JP | 2002-157919 A | 5/2002 |
| JP | 2005-026548 A | 1/2005 |
| JP | 2011-154819 A | 8/2011 |

OTHER PUBLICATIONS

International Search Report for PCT/JP2014/065338 dated Sep. 9, 2014; English translation submitted herewith (5 Pages).

Office Action of counterpart SG Patent Application No. 11201509846W dated Oct. 12, 2017 in English.

* cited by examiner

Fig.3
(a)
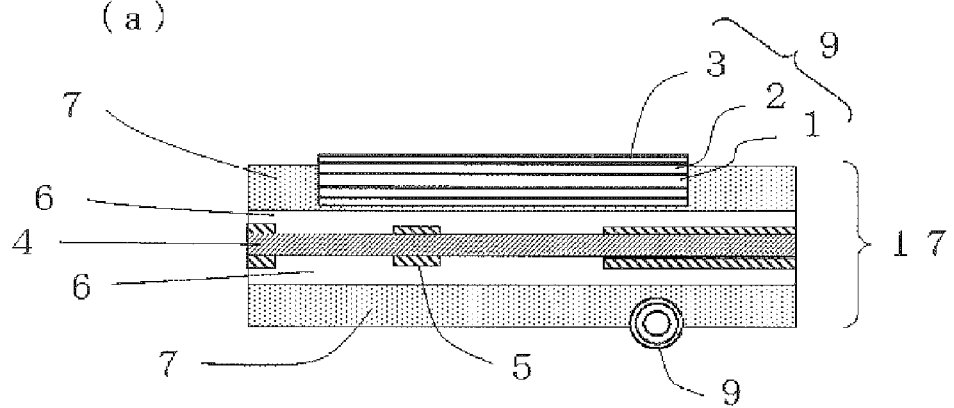
(b)
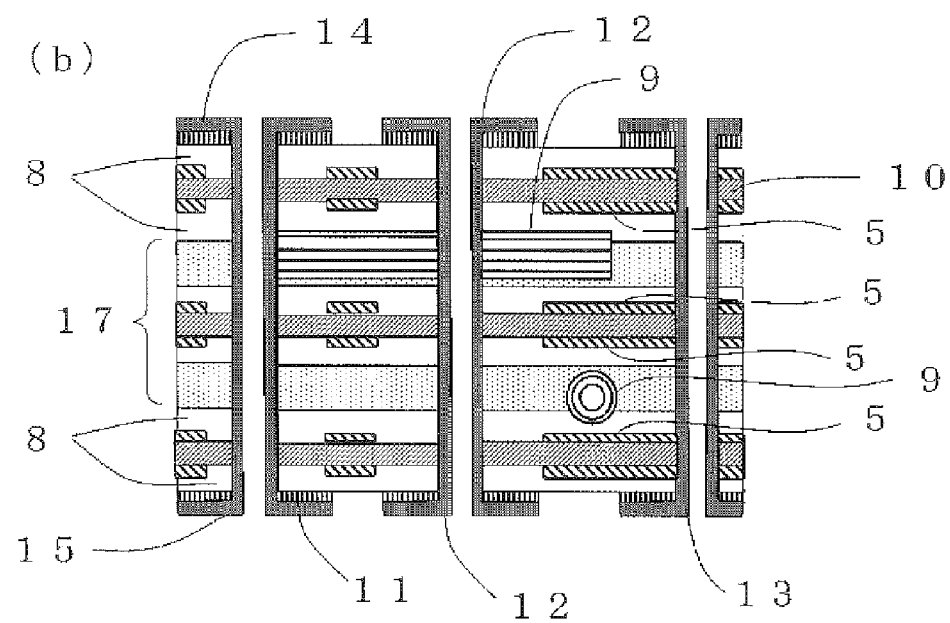

INSULATED COATED WIRE HAVING A WIRE COATING LAYER OF A RESIN SURROUNDED BY A WIRE ADHESIVE LAYER OF A RESIN

TECHNICAL FIELD

The present invention relates to an insulated coated wire and a multi-wire wiring board, and, more particularly, but not by way of limitation, an insulated coated wire and a multi-wire wiring board which can also support a high frequency signal of approximately 10 GHz or higher.

BACKGROUND ART

In recent years, in accordance with development of functions of electronic equipment, wiring boards with extremely high wiring density are desired. As such wiring boards with high wiring density, there is a wiring board in which a wire is used for necessary wiring. Hereinafter, an electric wire used as wiring will be referred to as a 'wire,' and a wiring board in which the electric wire is used as wiring will be referred to as a "multi-wire wiring board."

A multi-wire wiring board is manufactured by, after forming an adhesive sheet (adhesive insulation layer) having adhesive property on an inner layer substrate on which circuits such as a power supply layer and a ground layer are formed, wiring (making a wire adhere with ultrasound while making the wire run on the adhesive layer) a wire coated with a polyimide resin, or the like, using a numerical control wiring machine, fixing the wire through lamination, or the like, making a through-hole which crosses the wire, and performing electroless metal plating on inside of the through-hole. As the insulated coated wire used in this multi-wire wiring board, an insulated coated wire having a wire, a wire coating layer disposed around the wire, and a wire adhesive layer disposed around the wire coating layer, is used (see, e.g., Patent Literatures 1 to 4).

CITATION LIST

Patent Literature

Patent Literature 1: Japanese Examined Patent Publication No. S45-21434
Patent Literature 2: Japanese Unexamined Patent Publication No. H6-309936
Patent Literature 3: Japanese Unexamined Patent Publication No. H11-260152
Patent Literature 4: Japanese Unexamined Patent Publication No. 2002-50850

SUMMARY OF THE INVENTION

Technical Problem

In recent years, in accordance with increases in speed of electronic equipment, the frequency of an electric signal flowing inside a wiring board has become higher and higher in order to transmit more information in a short period of time. In substrate design for supporting such high frequencies, it is necessary to take into account (I) conductor loss and (II) dielectric loss. While, for (I) conductor loss, it is effective to make wiring that becomes a signal line thicker, there is limitation in a wiring width of the signal line in a wiring board with higher density. Therefore, improvement of (II) dielectric loss has become important. While, for (II) dielectric loss, it is effective to reduce relative permittivity and dielectric tangent of an insulation material, such as a core base material and a prepreg, disposed around the wiring which becomes a signal line, a material such as a core base material and a prepreg for supporting high frequencies is more costly than a general material. Here, high frequency is, though not limited to, particularly, a high frequency signal of approximately 10 GHz or higher, and a material supporting high frequency is a material such as a core base material and a prepreg which has smaller relative permittivity than that of a general FR-4 material (having a relative permittivity of approximately 3.9 at 10 GHz) and which suppresses transmission loss for the high frequency signal.

Concerning the multi-wire wiring board, first, for (I) conductor loss, in a multi-wire wiring board which uses an insulated coated wire using a conventional polyimide (having a relative permittivity of 3.6 at 10 GHz) wire coating layer, when a wire diameter is 0.10 mm, transmission loss at 10 GHz is from −40 to 45 dB/m, and it can be considered that the wire diameter is made 0.16 mm or larger to support high frequencies of 10 GHz or higher. Here, the wire diameter is a diameter of an electric wire not including a wire coating layer. However, when the wire diameter is made larger, wiring density is reduced and wiring capacity per one layer is reduced, which results in increase of a layer structure and increase of board thickness, and it is difficult to design a substrate.

Next, for (II) dielectric loss of the multi-wire wiring board, while, it is possible to use a high frequency material as a material of an insulation layer (a core base material and a prepreg) to be used for the multi-wire wiring board and an adhesive layer of a wiring adhesive sheet to support high frequencies, because the high frequency material is used in a large part of the multi-wire wiring board, there is a problem that cost becomes higher.

The present invention has been made in view of the above, and an object of the present invention is to provide an insulated coated wire and a multi-wire wiring board which can support high frequency while suppressing increase of cost.

Solution to the Problem

Solution to Problem

The present invention relates to the following:
1. An insulated coated wire comprising: a wire; a wire coating layer disposed around the wire; and a wire adhesive layer disposed around the wire coating layer, wherein the wire coating layer is of one type or a combination of two or more types of a fluorine resin, a polyamide-imide resin and a low dielectric polyimide resin having a relative permittivity of less than 3.6 at 10 GHz.
2. The insulated coated wire according to an item 1, wherein the wire adhesive layer is of one type or a combination of two or more types of a fluorine resin, a polyamide-imide resin and a low dielectric polyimide resin having a relative permittivity of less than 3.6.
3. The insulated coated wire according to an item 1 or 2, wherein relative permittivity of the wire coating layer at 10 GHz is from 2.1 to 3.2, or relative permittivity of the wire adhesive layer at 10 GHz is from 2.6 to 3.2.
4. A multi-wire wiring board having a microstrip structure or a strip structure, comprising: the insulated coated wire according to any one of items 1 to 3; an insulation layer disposed around the insulated coated wire; and a conductor pattern disposed on the insulation layer.

5. A multi-wire wiring board having a strip structure, comprising: the insulated coated wire according to any one of items 1 to 3; an insulation layer disposed around the insulated coated wire; and conductor patterns disposed so as to face each other across the insulated coated wire with the insulation layer interposed therebetween.

Advantageous Effects of the Invention

According to the present invention, it is possible to provide an insulated coated wire and a multi-wire wiring board which can support high frequency while suppressing increase of cost.

BRIEF DESCRIPTION OF THE DRAWINGS

FIGS. 3(a) and 3(b) are flow diagrams of manufacturing processed of a multi-wire wiring board according to Examples of the present invention and a Comparative example.

DETAILED DESCRIPTION OF THE EMBODIMENTS

Figure 1:
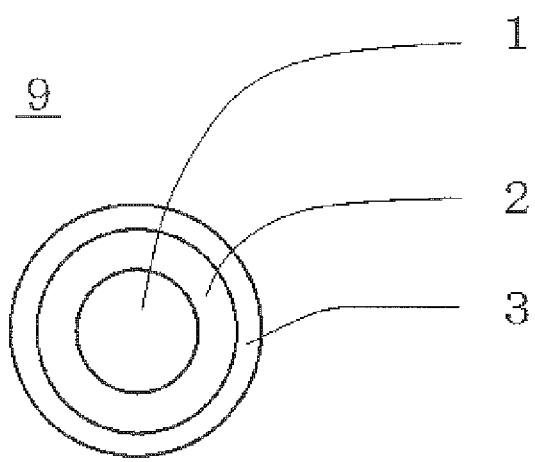
FIG. 1 illustrates a schematic cross-section diagram of an insulated coated wire according to one embodiment of the present invention.
Figure 2:
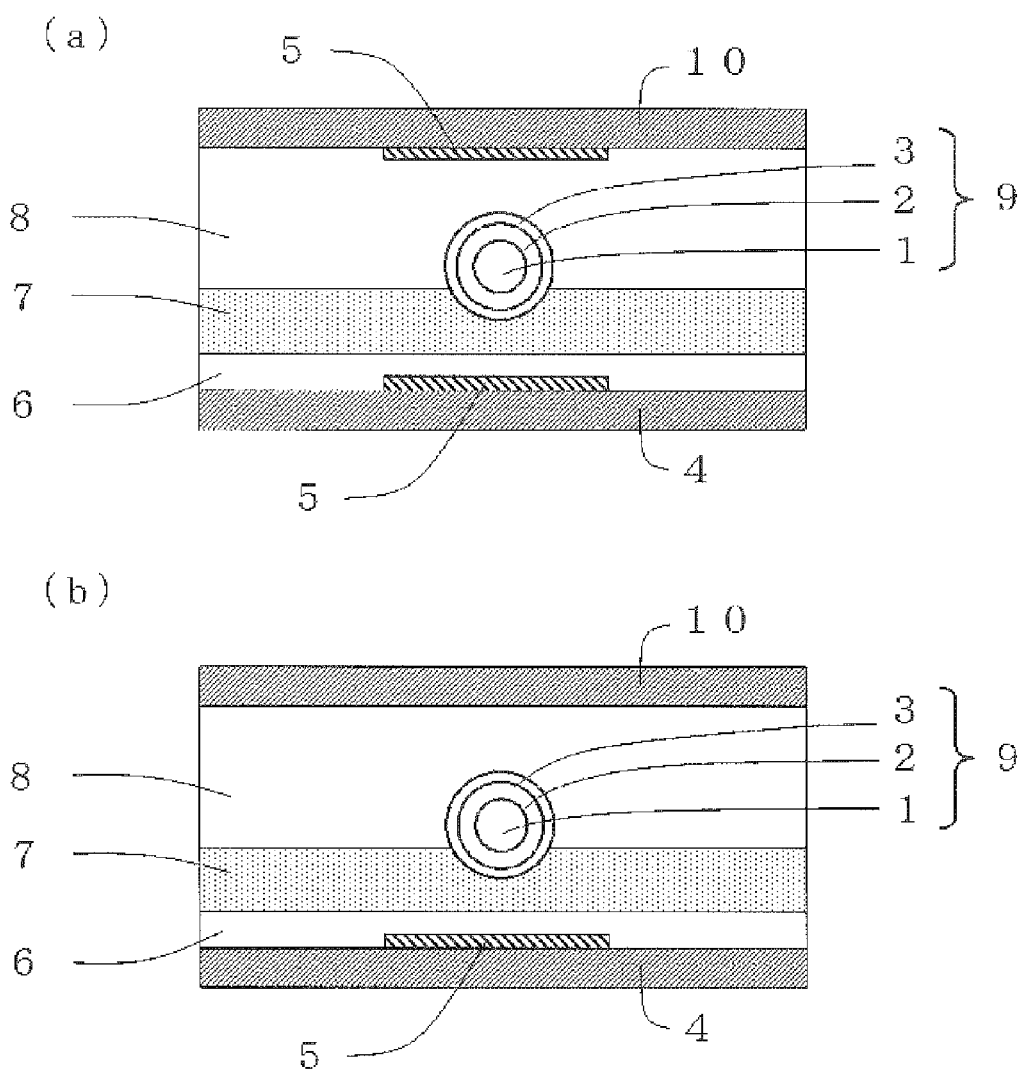
FIGS. 2(a) and 2(b) are schematic cross-section diagrams of a multi-wire wiring board according to one embodiment of the present invention.

FIG. 1 illustrates an insulated coated wire according to one embodiment of the present invention, and FIGS. 2(a) and 2(b) respectively illustrate schematic cross-section diagrams of a multi-wire wiring board according to one embodiment of the present invention.

(Insulated Coated Wire)

As illustrated in FIG. 1, the insulated coated wire 9 in the present embodiment includes a wire 1 which becomes a signal line, a wire coating layer 2 disposed around the wire 1, and a wire adhesive layer 3 disposed around the wire coating layer 2, and the wire coating layer 2 is of one type of or a combination of two or more types of a fluorine resin, a polyamide-imide resin and a low dielectric polyimide resin.

As described above, because in the insulated coated wire of the present embodiment, an insulation material, such as a fluorine resin, a polyamide-imide resin and a low dielectric polyimide resin, having smaller relative permittivity than that of conventionally used polyimide (having a relative permittivity of 3.6 at 10 GHz) is used as a material of the wire coating layer, which reduces relative permittivity of the wire coating layer disposed around the wire and reduces dielectric loss of a high frequency signal, it is possible to improve transmission characteristics. Further, while these materials having small relative permittivity, used as the wire coating layer, are generally costly, because these materials are only used around the wire, which requires a small amount of these materials to be used, it is possible to suppress increase of cost as the whole multi-wire wiring board.

The insulated coated wire is a wire obtained by coating a wire which becomes a signal line with an insulation resin. As illustrated in FIG. 1, the insulated coated wire 9 of the present embodiment includes a wire 1 which becomes a signal line, a wire coating layer 2 of the insulation resin disposed around the wire 1, and a wire adhesive layer 3 of the insulation resin disposed around the wire coating layer 2.

The wire is an electric wire which becomes a signal line. As for the wire, copper is typically used. Further, the wire diameter is a diameter of only the electric wire except the insulation resin which coats the wire.

The wire coating layer which is a layer coating the wire which become a signal line, is formed using an insulation resin. As such an insulation resin, one type of or a combination of two or more types of a fluorine resin, a polyamide-imide resin and a low dielectric polyimide resin is used.

Examples of the fluorine resin used in the wire coating layer include PFA (perfluoro alkoxy alkane) and ETFE (ethylene-tetrafluoroethylene copolymer). Examples of the polyamide-imide resin include a siloxane-modified polyamide-imide resin. The low dielectric polyimide resin is a polyimide resin having a relative permittivity of less than 3.6 at 10 GHz, and examples of the low dielectric polyimide resin include a fluorine-containing polyimide resin.

A value of the relative permittivity is a value measured using a tri-plate strip line resonator method (ASSOCIATION CONNECTING ELECTRONICS INDUSTRIES, TEST METHODS MANUAL, IPC-TM-650 2.5.5.5) at 10 GHz, and the same is applied hereafter.

As a method for forming a wire coating layer, in the case of a fluorine resin (such as PFA and ETFE), it is possible to use a so-called extracting method in which the fluorine resin (such as PFA and ETFE) formed into a pellet type is melted within a furnace at approximately 300° C., and the wire is made to pass through the melted resin and extracted so that the resin is fused to the wire. Further, in the case of a polyamide-imide resin or a low dielectric polyimide resin, in addition to the above-described extracting method, it is possible to use a method in which the polyamide-imide resin or the low dielectric polyimide resin is mixed with an organic solvent to prepare a varnish, and the varnish is coated around the wire as another method.

The thickness of the wire coating layer is, though not particularly limited, approximately 10 to 20 μm. If the thickness of the wire coating layer falls within such a range, the relative permittivity of the wire coating layer is effective to improve transmission loss of a high frequency signal, and, even if the wire adhesive layer is disposed around the wire coating layer, it is possible for the insulated coated wire to have a wiring property, and it is appropriate for handling.

The wire adhesive layer is a layer which is disposed around the wire coating layer and which makes the insulated coated wire adhere to an adhesive sheet (adhesive insulation layer) for wiring disposed below the insulated coated wire through wiring.

It is preferable that the wire adhesive layer should be an insulated coated wire which is of one type of or a combination of two or more types of a fluorine resin, a polyamide-imide resin and a low dielectric polyimide resin.

As described above, in the insulated coated wire of the present embodiment, because an insulation material, such as a fluorine resin, a polyamide-imide resin and a low dielectric polyimide resin, having small relative permittivity is used as a material of the wire adhesive layer, which reduces the relative permittivity of not only the wire coating layer but also the wire adhesive layer disposed around the wire coating layer, and reduces dielectric loss of a high frequency signal, it is possible to improve transmission characteristics. Further, while these materials, having small relative permittivity and used as the wire adhesive layer, are typically costly, these materials are used only around the wire coating layer, which requires a small amount of these materials to be used, so that it is possible to suppress an increase in the cost of the wiring board as a whole.

As with the case of the wire coating layer, examples of the fluorine resin used for the wire adhesive layer include PFA (perfluoro alkoxy alkane) and ETFE (ethylene-tetrafluoro-ethylene copolymer). Examples of the polyamide-imide resin include a siloxane-modified polyamide-imide resin. The low dielectric polyimide resin is a polyimide resin having a relative permittivity of less than 3.6 at 10 GHz, and examples of the low dielectric polyimide resin include a fluorine-containing polyimide resin.

It is preferable that the insulated coated wire include the wire coating layer having a relative permittivity of from 2.1 to 3.2 at 10 GHz or the wire adhesive layer having a relative permittivity of from 2.6 to 3.2 at 10 GHz. Examples of a resin used for such a wire coating layer or a wire adhesive layer include PFA and ETFE as a fluorine resin.

As described above, because in the insulated coated wire of the present embodiment, the relative permittivity of the wire coating layer and the relative permittivity of the wire adhesive layer are smaller than that of a typical FR-4 material (having a relative permittivity of approximately 3.9 at 10 GHz), and thus dielectric loss of a high frequency signal is small, and therefore it is possible to improve transmission characteristics. Further, while these materials, having small relative permittivity and used as the wire coating layer or the wire adhesive layer, are typically costly, because these materials are used only around the wire or the wire coating layer, which requires a small amount of these materials to be used, it is possible to suppress increase of cost as the whole wiring board.

(Multi-Wire Wiring Board)

As illustrated in FIGS. 2(a) and 2(b), a multi-wire wiring board of the present embodiment is a multi-wire wiring board having a microstrip structure or a strip structure, including the insulated coated wire 9 (includes a wire 1 which becomes a signal line, a wire coating layer 2 disposed around the wire 1, and a wire adhesive layer 3 disposed around the wire coating layer 2) according to the above-described embodiment, an insulation layer (a prepreg 6 and an adhesive sheet 7 for wiring or a prepreg 8) disposed around the insulated coated wire 9, and conductor patterns 5 disposed with the insulation layer (the prepreg 6 and the adhesive sheet 7 for wiring or the prepreg 8) interposed therebetween.

As described above, in the multi-wire wiring board of the present embodiment, because an insulation material such as a fluorine resin, a polyamide-imide resin and a low dielectric polyimide resin, having small relative permittivity, is used as a material of the wire coating layer, which reduces the relative permittivity of the wire coating layer disposed around the wire and which reduces dielectric loss of a high frequency signal, it is possible to improve transmission characteristics. Further, while these materials having small relative permittivity used as the wire coating layer are typically costly, because these materials are used only around the wire, which requires a small amount of these materials to be used, it is possible to suppress increase of cost as the whole wiring board. Further, because a microstrip structure or a strip structure is formed by providing conductor patterns around the insulated coated wire with the insulation layer interposed therebetween, it is possible to reduce dielectric loss of a high frequency signal and improve transmission characteristics only by using a material having small relative permittivity for the wire coating layer.

As illustrated in FIGS. 2(a) and 2(b), the insulation layer disposed around the insulated coated wire 9 is formed with an insulation material for multilayer adhesion such as a prepreg 6 as an underlay layer used for adhesion to the core base material 4 and a prepreg 8 as an insulation material used for adhesion to the adhesive sheet 7 for wiring or the core base material 10 used for wiring the insulated coated wire 9.

As illustrated in FIGS. 2(a) and 2(b), the conductor patterns 5 disposed with the insulation layer (the prepreg 6 and the adhesive sheet 7 for wiring or the prepreg 8) interposed therebetween may be disposed on one side or both sides of the insulated coated wire 9 by laminating the conductor patterns 5 formed by processing a copper foil of a copper clad laminate to make a circuit with insulation materials for multilayer adhesion such as the adhesive sheet 7 for wiring and the prepregs 6 and 8 interposed therebetween.

As illustrated in FIG. 2(a), it is preferable that the multi-wire wiring board have a strip structure including the insulated coated wire 9 according to the above-described embodiment, the insulation layer (the prepreg 6 and the adhesive sheet 7 for wiring or the prepreg 8) disposed around the insulated coated wire 9, and the conductor patterns 5 disposed so as to face each other across the insulated coated wire 9 through the insulation layer (the prepreg 6 and the adhesive sheet 7 for wiring or the prepreg 8).

As described above, because it is possible to make the strip structure using the conductor patterns disposed so as to face each other across the insulated coated wire through the insulation layer, it is possible to reduce dielectric loss of a high frequency signal and improve transmission characteristics only by using a material having small relative permittivity for the wire coating layer.

EXAMPLES

Example 1

FIGS. 3(a) and 3(b) schematically illustrate manufacturing process of an insulated coated wire 9 and a multi-wire wiring board using the insulated coated wire 9 according to the present example.

As illustrated in FIG. 3(a), the insulated coated wire 9 of the present example includes a wire 1 which becomes a signal line, a wire coating layer 2 disposed around the wire 1, and a wire adhesive layer 3 disposed around the wire coating layer 2. Teflon PFA (manufactured by Du Pont-Mitsui Fluorochemicals Co., Ltd., product name "Teflon," i.e., polytetrafluoroethylene, is a registered trademark) which is a fluorine resin, is used for the wire coating layer 2, and the wire coating layer 2 is fused around the wire 1 using an extracting method. Teflon ETFE (manufactured by Du Pont-Mitsui Fluorochemicals Co., Ltd., product name "Teflon" is a registered trademark) which is a fluorine resin, is used for the wire adhesive layer 3, and the wire adhesive layer 3 is fused around the wire coating layer 2 using the extracting method. In this manner, the insulated coated wire 9 was prepared.

As illustrated in FIG. 3(a), a circuit is formed on a core base material 4 of a copper clad laminate (manufactured by Hitachi Chemical Co., Ltd., product name: MCL-I-671) to form a conductor pattern 5, and an underlay layer 6 is formed through lamination with a prepreg 6 (manufactured by Hitachi Chemical Co., Ltd., product name: MCL-I-671), and an adhesive sheet 7 for wiring (manufactured by Hitachi Chemical Co., Ltd., product name: HPAI) is laminated, the insulated coated wire 9 prepared as described above is wired and fixed. A thermoset sheet was used for the adhesive sheet 7 for wiring, and the wiring substrate 17 was manufactured by after wiring the insulated coated wire 9 with ultrasound output of 25 kHz and at wiring speed of 25 mm/sec using a numerical control apparatus, curing and fixing the wire adhesive layer 3 of the insulated coated wire 9 and the adhesive sheet 7 for wiring through thermal treatment for 90 minutes at 200° C.

As illustrated in FIG. 3(b), the multi-wire wiring board was manufactured by integrally laminating multiple layers of copper foil 11 (manufactured by Nippon Denkai, Ltd., product name: NDGR) on both faces of the wiring substrate 17 prepared as described above through heat press through the prepreg 8 (manufactured by Hitachi Chemical Co., Ltd., Product name: GFA-2) as an insulation material, then, making through-holes at a position where the wire 1 of the insulated coated wire 9 is to be connected to conductor patterns 15 in surface layers and at a position where the conductor patterns 5 (ground layer) in inner layers are to be connected to the conductor patterns 15 in the surface layers using a drill, and, after cleaning the through-holes through permanganic treatment, forming the conductor patterns 15 through etching after plating the through-holes using electroless copper plating (manufactured by Hitachi Chemical Co., Ltd., product name: L-60). Reference numeral 5 represents a conductor pattern or ground (in inner layer); 10 represents the core base material of the copper clad laminate; 12 represents a through hole; 13 a through hole (connecting ground layer and conductor pattern in surface layer); and 14 represents a metal plating.

Example 2

As illustrated in FIG. 3(a), in the insulated coated wire 9 of the present example, Teflon ETFE (manufactured by Du Pont-Mitsui Fluorochemicals Co., Ltd. product name "Teflon" is a registered trademark) which is a fluorine resin is used for both the wire coating layer 2 and the wire adhesive layer 3, and is fused around the wire 1 using the extracting method. The insulated coated wire 9 was prepared in a similar manner to Example 1 except the above point.

As illustrated in FIGS. 3(a) and 3(b), in a similar manner to Example 1, the wiring substrate 17 and the multi-wire wiring board were manufactured.

Example 3

As illustrated in FIG. 3(a), in the insulated coated wire 9 of the present example, low dielectric polyimide (manufactured by Du Pont, fluorine-containing polyimide) having a relative permittivity of 3.6 at 10 GHz is used for the wire coating layer 2, and the wire coating layer 2 is fused around the wire 1 using the extracting method. A siloxane-modified polyimide-amide resin (manufactured by Hitachi Chemical Co., Ltd., product name: KS-6600) is used for the wire adhesive layer 3, and the wire adhesive layer 3 is fused around the wire coating layer 2 using the extracting method. The insulated coated wire 9 was prepared in a similar manner to Example 1 except the above point.

As illustrated in FIGS. 3(a) and 3(b), the wiring substrate 17 and the multi-wire wiring board were manufactured in a similar manner to Example 1.

Comparative Example

As illustrated in FIG. 3(a), in the insulated coated wire 9 of the present example, conventional polyimide (manufactured by Industrial Summit Technology Corporation, product name: Pyre-ML) is used for the wire coating layer 2, and the wire coating layer 2 is fused around the wire 1 using the extracting method in which the fluorine resin is melted and the wire is made to pass through the melted resin and extracted so that the resin is fused to the wire. A siloxane-modified polyimide-amide resin (manufactured by Hitachi Chemical Co., Ltd., product name: KS-6600) is used for the wire adhesive layer 3, and the wire adhesive layer 3 is fused around the wire coating layer 2 using the extracting method. The insulated coated wire 9 was prepared in a similar manner to Example 1 except the above point.

As illustrated in FIGS. 3(a) and 3(b), the wiring substrate 17 and the multi-wire wiring board were manufactured in a similar manner to Example 1.

Figure 4:
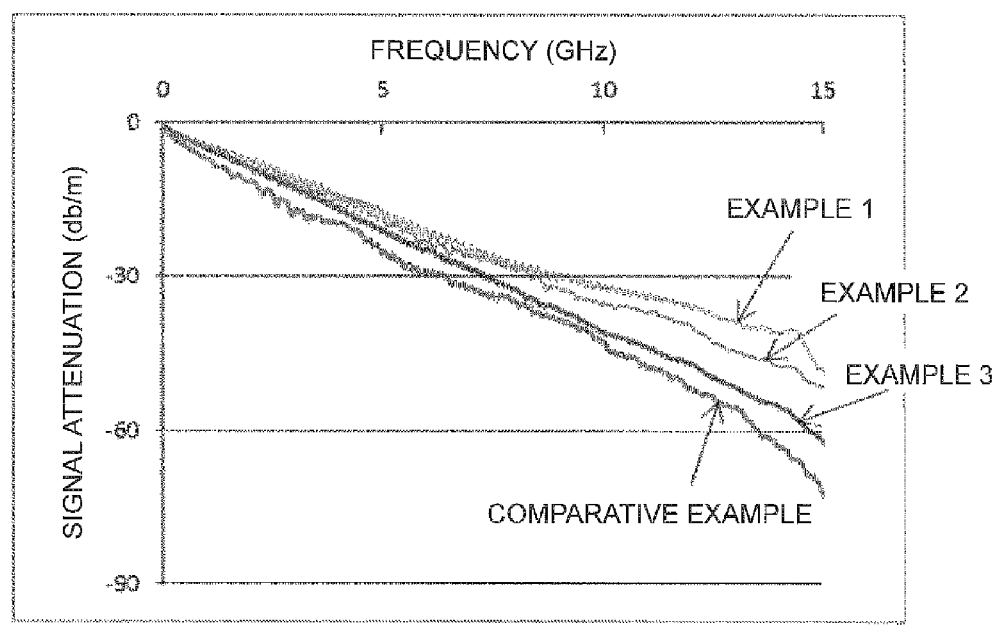
FIG. 4 is measured data of transmission characteristics regarding the multi-wire wiring board according to the Examples of the present invention and Comparative example.

Measurement results of values of relative permittivity and dielectric tangent concerning the multi-wire wiring boards of Examples 1 to 3 and Comparative example are shown in Table 1 and FIG. 4 (which shows the signal attenuation (db/m) vs. the frequency (GHz)). The values of the relative permittivity and the dielectric tangent shown in Table 1 are all values at frequency of 10 GHz in signal attenuation measurement results measured using a tri-plate strip line resonator method (IPC-TM-650 2.5.5.5) in FIG. 4. The transmission characteristics of the multi-wire wiring board excel for smaller relative permittivity and dielectric tangent of the wire coating layer and the wire adhesive layer as shown in Table 1 and FIG. 4. As described above, the wire multilayer wiring board which excels in signal transmission characteristics can be obtained.

TABLE 1

| ITEM | | EXAMPLE 1 | EXAMPLE 2 | EXAMPLE 3 | COMPARATIVE EXAMPLE |
|---|---|---|---|---|---|
| INSULATED COATED WIRE | WIRE | DIAMETER 0.10 mm (Cu) | DIAMETER 0.10 mm (Cu) | DIAMETER 0.10 mm (Cu) | DIAMETER 0.10 mm (Cu) |
| | WIRE COATING LAYER | FLUORINE RESIN (PFA), RELATIVE PERMITTIVITY 2.1, DIELECTRIC TANGENT 0.001, (THICKNESS OF 0.016 mm) | FLUORINE RESIN (ETFE), RELATIVE PERMITTIVITY 2.6, DIELECTRIC TANGENT 0.005, (THICKNESS OF 0.016 mm) | LOW DIELECTRIC POLYIMIDE RESIN, RELATIVE PERMITTIVITY 2.9, DIELECTRIC TANGENT 0.006, (THICKNESS OF 0.016 mm) | CONVENTIONAL POLYIMIDE RESIN, RELATIVE PERMITTIVITY 3.6, DIELECTRIC TANGENT 0.010, (THICKNESS OF 0.016 mm) |

TABLE 1-continued

| ITEM | EXAMPLE 1 | EXAMPLE 2 | EXAMPLE 3 | COMPARATIVE EXAMPLE |
|---|---|---|---|---|
| WIRE ADHESIVE LAYER | FLUORINE RESIN (ETFE), RELATIVE PERMITTIVITY 2.6, DIELECTRIC TANGENT 0.005, (THICKNESS OF 0.014 mm) | FLUORINE RESIN (ETFE), RELATIVE PERMITTIVITY 2.6, DIELECTRIC TANGENT 0.005, (THICKNESS OF 0.014 mm) | POLYAMIDE-IMIDE RESIN, RELATIVE PERMITTIVITY 3.4, DIELECTRIC TANGENT 0.025, (THICKNESS OF 0.014 mm) | POLYAMIDE-IMIDE RESIN, RELATIVE PERMITTIVITY 3.4, DIELECTRIC TANGENT 0.025, (THICKNESS OF 0.014 mm) |
| SIGNAL ATTENUATION MEASURED VALUE (VALUE AT 10 GHz) | −31.5 dB/m | −35.0 dB/m | −40.7 dB/m | −42.8 dB/m |

REFERENCE SIGNS LIST

1 . . . Wire or Signal line
2 . . . Wire coating layer
3 . . . Wire adhesive layer
4 . . . Core base material (of copper clad laminate used in wiring substrate)
5 . . . Conductor pattern or ground (in inner layer)
6 . . . Underlay layer or prepreg
7 . . . Adhesive sheet for wiring
8 . . . Insulation material or prepreg
9 . . . Insulated coated wire
10 . . . Core base material (of copper clad laminate used for multilayer)
11 . . . Copper foil (used for multilayer)
12 . . . Through hole (connecting wire and conductor pattern in surface layer)
13 . . . Through hole (connecting ground layer and conductor pattern in surface layer)
14 . . . Metal plating
15 . . . Conductor pattern or signal line (in surface layer)
17 . . . Wiring substrate

The invention claimed is:

1. An insulated coated wire comprising:
a wire;
a wire coating layer disposed around the wire, wherein the wire coating layer is of one type of or a combination of two or more types of a fluorine resin, a polyamide-imide resin and a low dielectric polyimide resin having a relative permittivity of less than 3.6 at 10 GHz; and
a wire adhesive layer disposed around the wire coating layer, wherein the wire adhesive layer is of one type of or a combination of two or more types of a fluorine resin or, a polyamide-imide resin having a relative permittivity of less than 3.6.

2. The insulated coated wire according to claim 1, wherein the wire coating layer is of the one type or the combination of two or more types of a fluorine resin and the low dielectric polyimide resin having a relative permittivity of less than 3.6 at 10 GHz.

3. The insulated coated wire according to claim 1, wherein relative permittivity of the wire coating layer at 10 GHz is from 2.1 to 3.2 or relative permittivity of the wire adhesive layer at 10 GHz is from 2.6 to 3.2.

4. A multi-wire wiring board having a microstrip structure or a strip structure, comprising: the insulated coated wire according to claim 1; an insulation layer disposed around the insulated coated wire; and a conductor pattern disposed on the insulation layer.

5. A multi-wire wiring board having a strip structure, comprising: the insulated coated wire according to claim 1; an insulation layer disposed around the insulated coated wire; and conductor patterns disposed so as to face each other across the insulated coated wire with the insulation layer interposed therebetween.

6. A multi-wire wiring board having a strip structure, comprising:
an insulated coated wire comprising a wire, a wire coating layer disposed around the wire, wherein the wire coating layer is of one type of or a combination of two or more types of a fluorine resin, a polyamide-imide resin and a low dielectric polyimide resin having a relative permittivity of less than 3.6 at 10 GHz, and a wire adhesive layer disposed around the wire coating layer;
an insulation layer disposed around the insulated coated wire; and
conductor patterns disposed so as to face each other across the insulated coated wire with the insulation layer interposed therebetween.

7. The multi-wire wiring board according to claim 6, wherein relative permittivity of the wire coating layer at 10 GHz is from 2.1 to 3.2 or relative permittivity of the wire adhesive layer at 10 GHz is from 2.6 to 3.2.

8. The multi-wire wiring board according to claim 6, wherein the wire coating layer is of the one type or the combination of two or more types of a fluorine resin and the low dielectric polyimide resin having a relative permittivity of less than 3.6 at 10 GHz.

9. An insulated coated wire comprising:
a wire;
a wire coating layer disposed around the wire, wherein the wire coating layer includes a polyamide-imide resin having a relative permittivity of less than 3.6 at 10 GHz; and
a wire adhesive layer disposed around the wire coating layer.

10. The insulated coated wire according to claim 9, wherein relative permittivity of the wire coating layer at 10 GHz is from 2.1 to 3.2 or relative permittivity of the wire adhesive layer at 10 GHz is from 2.6 to 3.2.

11. A multi-wire wiring board having a microstrip structure or a strip structure, comprising: the insulated coated wire according to claim 9; an insulation layer disposed around the insulated coated wire; and a conductor pattern disposed on the insulation layer.

* * * * *

UNITED STATES PATENT AND TRADEMARK OFFICE
CERTIFICATE OF CORRECTION

PATENT NO.        : 9,966,164 B2
APPLICATION NO.   : 14/894695
DATED             : May 8, 2018
INVENTOR(S)       : Hiroyuki Yamaguchi et al.

Page 1 of 1

It is certified that error appears in the above-identified patent and that said Letters Patent is hereby corrected as shown below:

In the Claims

Claim 1 delete the "," at Column 9, Line 49, and delete "having a relative permittivity of less than 3.6" at Column 9, Lines 49-50.

Claim 9 delete "having a relative permittivity of less than 3.6 at 10 GHz" at Column 10, Lines 51-52.

Signed and Sealed this
Eleventh Day of December, 2018

Andrei Iancu
*Director of the United States Patent and Trademark Office*